United States Patent
Inada et al.

(10) Patent No.: US 11,035,037 B2
(45) Date of Patent: Jun. 15, 2021

(54) SUBSTRATE PROCESSING APPARATUS AND METAL MEMBER

(71) Applicant: KOKUSAI ELECTRIC CORPORATION, Tokyo (JP)

(72) Inventors: Tetsuaki Inada, Toyama (JP); Takuya Joda, Toyama (JP); Daisuke Hara, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/269,319

(22) Filed: Feb. 6, 2019

(65) Prior Publication Data

US 2019/0186000 A1 Jun. 20, 2019

Related U.S. Application Data

(63) Continuation of application No. PCT/JP2016/073599, filed on Aug. 10, 2016.

(51) Int. Cl.
*C23C 16/44* (2006.01)
*C23C 16/40* (2006.01)
(Continued)

(52) U.S. Cl.
CPC ........ *C23C 16/4404* (2013.01); *C23C 16/406* (2013.01); *C23C 16/44* (2013.01);
(Continued)

(58) Field of Classification Search
USPC ................. 118/500, 723, 729; 219/390, 400; 414/802; 211/41.18
See application file for complete search history.

(56) References Cited

U.S. PATENT DOCUMENTS

| | | | | |
|---|---|---|---|---|
| 9,587,313 B2 * | 3/2017 | Wada | ................ | H01L 21/02164 |
| 2005/0145584 A1 * | 7/2005 | Buckley | ............ | H01L 21/67306 |
| | | | | 211/41.18 |

(Continued)

FOREIGN PATENT DOCUMENTS

| | | | | |
|---|---|---|---|---|
| DE | 19937186 C1 * | 9/2000 | ........... | F16D 69/027 |
| JP | 2013-064170 A | 4/2013 | | |

(Continued)

OTHER PUBLICATIONS

International Search Report dated Nov. 15, 2016 for the International Application No. PCT/JP2016/073599.

*Primary Examiner* — Yewebdar T Tadesse
(74) *Attorney, Agent, or Firm* — Volpe Koenig

(57) ABSTRACT

There is provided a substrate processing apparatus including a process chamber in which a substrate is accommodated, a processing gas supply system configured to introduce a processing gas containing hydrogen peroxide into the process chamber and an exhaust system configured to exhaust an interior of the process chamber, wherein at least one selected from the group of the process chamber, the processing gas supply system, and the exhaust system includes a metal member, the metal member exposed to the processing gas or a liquid generated by liquefying the processing gas is made of a material containing an iron element, and a surface of a plane of the metal members, which is exposed to the processing gas or the liquid, is formed of a layer containing iron oxide which is formed by performing a baking process on the metal member.

10 Claims, 8 Drawing Sheets

(51) Int. Cl.
*C23C 16/458* (2006.01)
*H01L 21/67* (2006.01)
*H01L 21/673* (2006.01)
*H01L 21/02* (2006.01)

(52) U.S. Cl.
CPC ...... *C23C 16/4412* (2013.01); *C23C 16/4586* (2013.01); *H01L 21/67288* (2013.01); *H01L 21/67309* (2013.01); H01L 21/02164 (2013.01); H01L 21/02222 (2013.01); H01L 21/02282 (2013.01); H01L 21/02326 (2013.01); H01L 21/02337 (2013.01); H01L 21/67109 (2013.01); H01L 21/67248 (2013.01); H01L 21/67253 (2013.01)

(56) References Cited

U.S. PATENT DOCUMENTS

| | | |
|---|---|---|
| 2014/0242299 A1 | 8/2014 | Okamura et al. |
| 2014/0302687 A1* | 10/2014 | Ashihara ........... H01L 21/02271 438/780 |
| 2015/0132972 A1 | 5/2015 | Wada et al. |
| 2015/0140835 A1 | 5/2015 | Tateno et al. |
| 2015/0262817 A1 | 9/2015 | Okuno et al. |

FOREIGN PATENT DOCUMENTS

| | | |
|---|---|---|
| WO | 2013/094680 A1 | 6/2013 |
| WO | 2014/017638 A1 | 1/2014 |
| WO | 2014/021220 A1 | 2/2014 |
| WO | 2015/016180 A1 | 2/2015 |

* cited by examiner

FIG. 6

| No. | 1 | 2 | 3 | 4 | 5 | 6 |
|---|---|---|---|---|---|---|
| Material | SUS304 | | | | | |
| Surface treatment | Not performed | First baking process (atmospheric baking) | Only composite electrolytic polishing ① (nitric acid+sodium nitrate) | Composite electrolytic polishing ① (nitric acid+sodium nitrate)+first baking process (atmospheric baking) | Only composite electrolytic polishing ② (sodium nitrate) | Composite electrolytic polishing ② (sodium nitrate)+second baking process (vacuum baking) |
| Main component near surface | CrOx (film formed by natural oxidation), Fe, Cr, Ni | FeOx | CrOx (film formed by electrolytic polishing) | CrOx, FeOx | CrOx (film formed by electrolytic polishing) | CrOx, FeOx |
| Change after immersion test — Weight change | +0.007% | -0.002% | -0.004% | -0.002% | +0.003% | +0.001% |
| Change after immersion test — Immersion liquid concentration change | -4.0% | 0% (Unchanged) | -1.4% | 0% (Unchanged) | -4.6% | -0.2% |
| Change after immersion test — Others | — | — | — | — | — | — |

FIG. 7

| No. | 7 | 8 | 9 | 10 |
|---|---|---|---|---|
| Material | Ni alloy (Hastelloy C-22) | | Y2O3 coating | NiF2 passive film |
| Surface treatment | Not performed | Second baking process (vacuum baking) | Not performed | Not performed |
| Main component near surface | CrOx (film formed by natural oxidation), Ni, Cr, Mo | CrOx | Y2O3 | NiF2 |
| Change after immersion test — Weight change | -0.064% | -0.061% | -0.004% | -0.048% |
| Change after immersion test — Immersion liquid concentration change | -31.6% (concentration 0%) | -31.2% | 0% (unchanged) | -0.06% |
| Change after immersion test — Others | | | Discoloration occurred | Black spots occurred |

SUBSTRATE PROCESSING APPARATUS AND METAL MEMBER

CROSS-REFERENCE TO RELATED APPLICATION

This application is a Bypass Continuation Application of PCT international Application No. PCT/JP2016/00073599, filed on Aug. 10, 2016, and designating the United States, the entire contents of which are incorporated herein by reference.

TECHNICAL FIELD

The present disclosure relates to a substrate processing apparatus and a metal member.

BACKGROUND

As one of the manufacturing processes of a semiconductor device, there is a case where substrate processing of forming a film on a substrate or processing a surface of the substrate is performed by supplying a processing gas containing hydrogen peroxide ($H_2O_2$) to the substrate accommodated within a reaction tube of a substrate processing apparatus.

In the substrate processing described above, there is a case where members of the substrate processing apparatus, which are exposed to the processing gas containing $H_2O_2$, are damaged by corrosion or the like, or contamination occurs in the reaction tube. Further, according to the processing condition, the processing gas supplied to the substrate is liquefied and stays inside the reaction tube, which may damage the members (parts or components) of the substrate processing apparatus due to the liquid staying inside. The present disclosure provides a technique capable of reducing damage to the members of the substrate processing apparatus.

SUMMARY

According to one of some embodiments of the present disclosure, there is provided a substrate processing apparatus or its related technique that includes a process chamber in which a substrate is accommodated, a processing gas supply system configured to introduce a processing gas containing hydrogen peroxide into the process chamber and an exhaust system configured to exhaust an interior of the process chamber, wherein at least one selected from the group of the process chamber, the processing gas supply system, and the exhaust system includes a metal member, the metal member exposed to the processing gas or a liquid generated by liquefying the processing gas is made of a material containing an iron element, and a surface of a plane of the metal member, which is exposed to the processing gas or the liquid, is formed of a layer containing iron oxide which is formed by performing a baking process on the metal member.

BRIEF DESCRIPTION OF DRAWINGS

FIG. 6 is a diagram showing results of immersion experiment in $H_2O_2$ water for each sample subjected to surface treatments Nos. 1 to 6.

FIG. 7 is a diagram showing results of immersion experiment in $H_2O_2$ water for each sample subjected to surface treatments Nos. 7 to 10.

DETAILED DESCRIPTION

<One or More Embodiments of the Present Disclosure>

One or more embodiments of the present disclosure will now be described with reference to FIGS. 1 to 3.

(1) Configuration of Substrate Processing Apparatus

Figure 1:
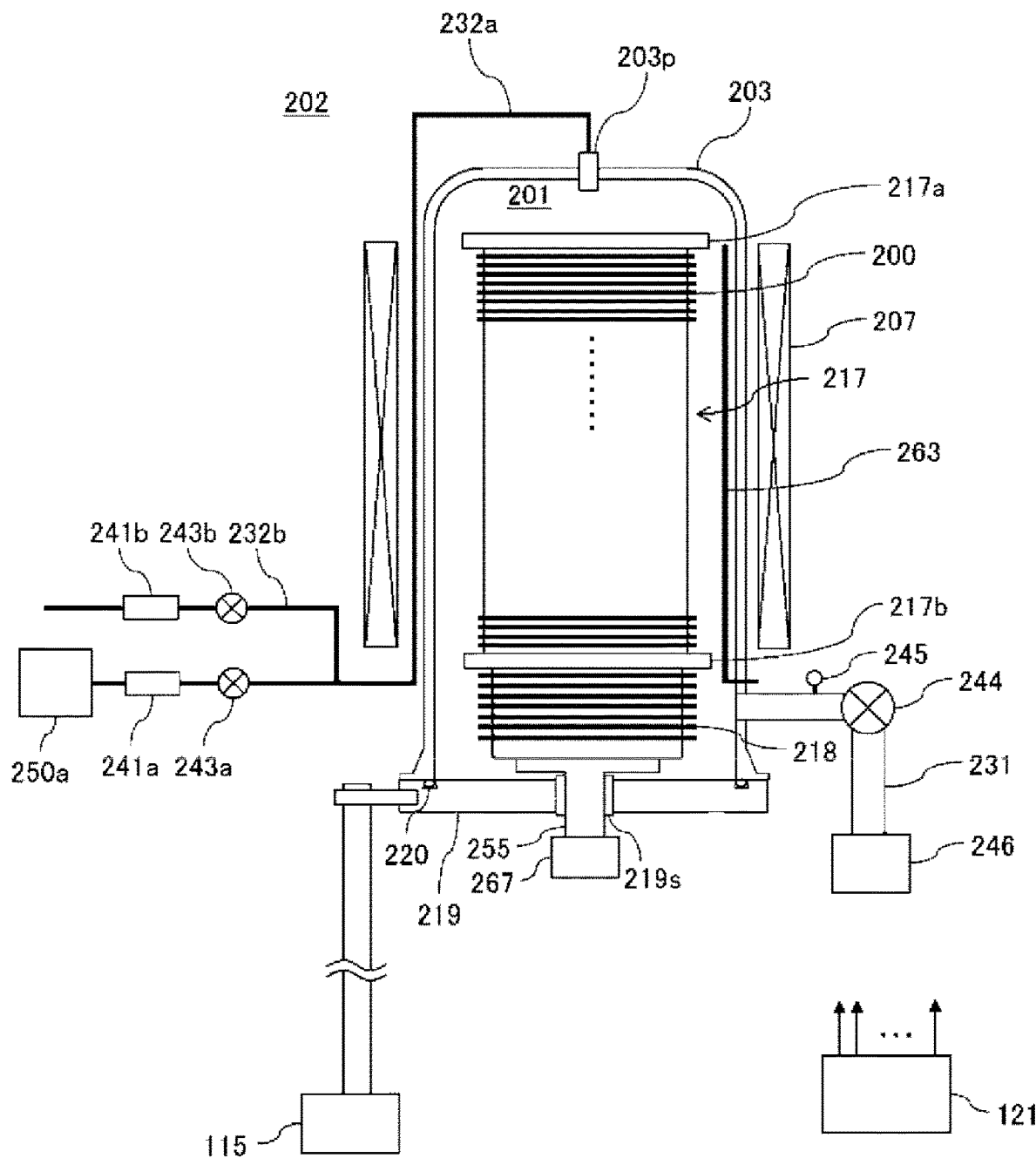
FIG. 1 is a schematic configuration diagram of a vertical type process furnace of a substrate processing apparatus suitably used in some embodiments of the present disclosure, in which a portion of the process furnace is shown in a vertical cross sectional view.
Figure 2:
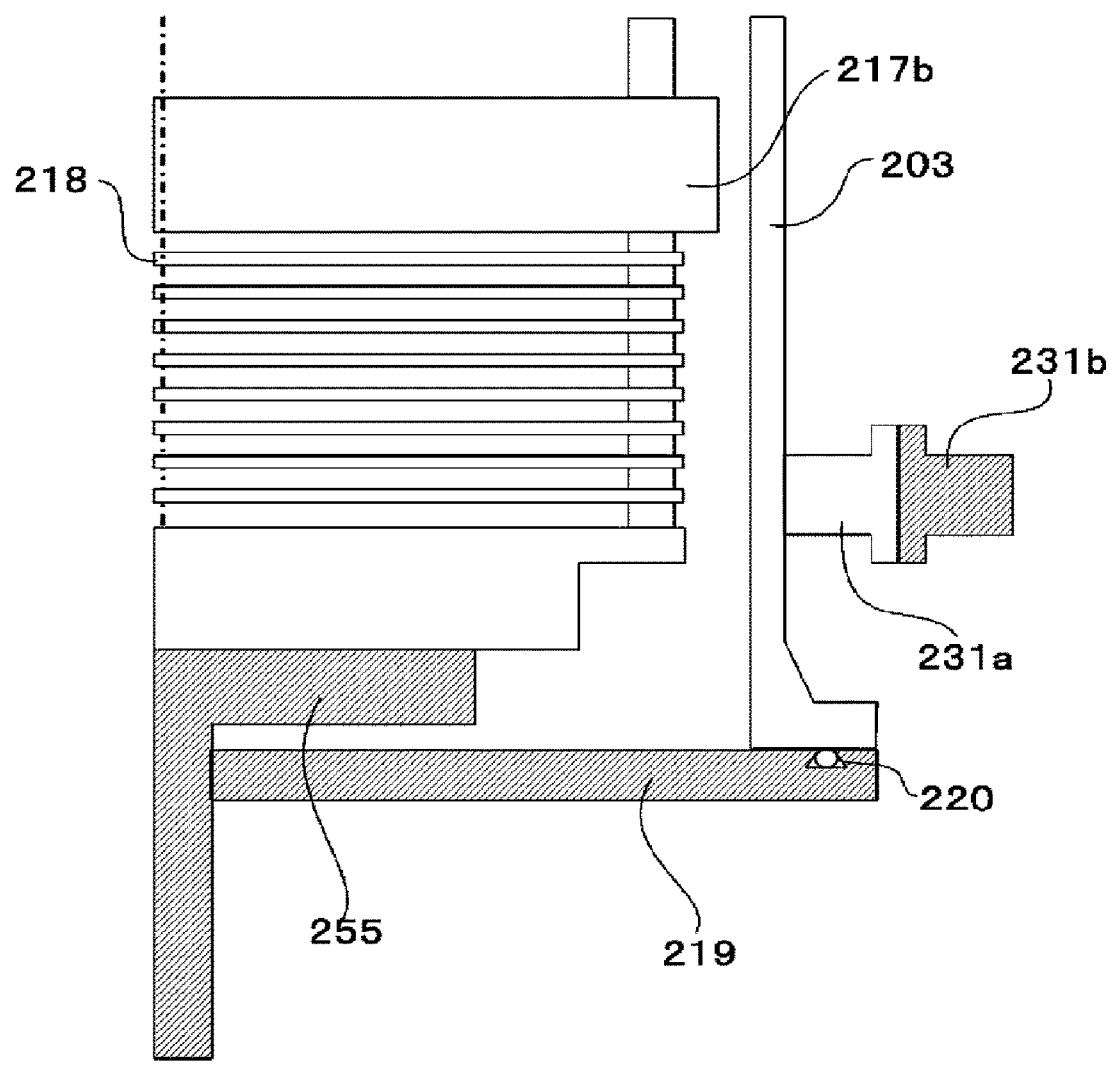
FIG. 2 is a schematic configuration diagram illustrating a configuration of a furnace opening peripheral region of a reaction tube.

As illustrated in FIG. 1, a process furnace 202 includes a reaction tube 203. The reaction tube 203 is made of a heat resistant material such as, for example, quartz ($SiO_2$), silicon carbide (SiC) or the like, and is configured as a cylindrical member having a gas supply port 203p at its upper end and a furnace opening (opening) at its lower end. A process chamber 201 is formed in a hollow cylindrical portion of the reaction tube 203. The process chamber 201 is configured to accommodate wafers 200 as substrates.

A seal cap 219 as a furnace opening cover configured to hermetically seal a lower end opening of the reaction tube 203 is installed under the reaction tube 203. The seal cap 219 is made of stainless steel (SUS) on which a process to be described later has been performed, and is formed in a disc shape. An O-ring 220, which is a seal member making contact with the lower end portion of the reaction tube 203, is installed on an upper surface of the seal cap 219. A rotation mechanism 267 is installed under the seal cap 219. A rotary shaft 255 of the rotation mechanism 267 penetrates the seal cap 219 and is connected to a boat 217 to be described later, thereby constituting a boat support part, which supports the boat 217 from below. Similar to the seal cap 219, the rotary shaft 255 is made of a SUS material on which a process to be described later has been performed. The rotation mechanism 267 is configured to rotate the wafers 200 by rotating the boat 217. A bearing part 219s of the rotary shaft 255, which is installed being opened to the rotary shaft 255, is configured with a fluid seal such as a magnetic seal. The seal cap 219 is vertically moved up and down by a boat elevator 115 installed under the reaction tube 203. The boat elevator 215 is configured with a transfer mechanism which loads and unloads (transfers) the boat 217, that is, the wafers 200, into and from the process chamber 201 by moving the seal cap 219 up and down.

The boat 217 as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as, e.g., quartz or SiC, and includes a top plate 217a and a bottom plate 217b at the top and bottom. Heat insulators 218 made of a heat resistant material such as, for example, quartz, SiC or the like are supported in a horizontal posture and in multiple stages at a lower portion of the boat 217, and are configured so as to suppress heat conduction between a wafer accommodation region and a furnace opening peripheral region in the reaction tube 203. The heat insulators 218 may be regarded as one of components of the boat 217. The bottom plate 217b may be installed below the heat insulators 218. The heat insulators 218 may be configured with dummy wafers made of quartz or the like and supported by the boat 217 in multiple stages. Further, the furnace opening peripheral region is a region extending from the lower end opening of the reaction tube 203 to the heat insulators 218, and may be regarded as including a region around the heat insulators 218.

A heater 207 for the substrate as a temperature adjustment part is installed outside the reaction tube 203. The substrate heater 207 is vertically installed so as to surround the wafer accommodation region in the reaction tube 203. The substrate heater 207 heats the wafers 200 accommodated in the wafer accommodation region to a desired temperature, and also functions as a liquefaction suppression mechanism for suppressing liquefaction of a gas by applying heat energy to the gas supplied into the reaction tube 203 or functions as an activation mechanism (an excitation part) configured to thermally activate (excite) the gas. A substrate temperature sensor 263 as a temperature detection part is installed in the reaction tube 203. Based on temperature information detected by the substrate temperature sensor 263, a state of supplying electric power to the substrate heater 207 is adjusted such that the interior of the process chamber 201 has a desired temperature distribution. The substrate temperature sensor 263 is installed along the inner wall of the reaction tube 203.

An exhaust pipe 231 for exhausting the gas in the reaction tube 203 to the outside of the reaction tube 203 is installed in the reaction tube 203. A pressure sensor 245 as a pressure detector (pressure detection part), which detects the internal pressure of the process chamber 201, is installed at an upstream side of the exhaust pipe 231. The exhaust pipe 231 is connected to a vacuum pump 246 as a vacuum exhaust device via an auto pressure controller (APC) valve 244 as a pressure regulator (pressure regulation part). The APC valve 244 is a valve configured so that the vacuum exhaust of the interior of the process chamber 201 and the vacuum exhaust stop can be performed by opening and closing the APC valve 244 while operating the vacuum pump 246 and so that the internal pressure of the process chamber 201 can be adjusted by adjusting the opening degree of the APC valve 244 based on the pressure information detected by the pressure sensor 245 while operating the vacuum pump 246. An exhaust system is mainly configured by the exhaust pipe 231 and the APC valve 244. The pressure sensor 245 and the vacuum pump 246 may be regarded as being included in the exhaust system.

A gas supply pipe 232a is connected to the gas supply port 203p. A gas generator 250a for generating a processing gas, a mass flow controller (MFC) 241a, which is a flow rate controller (flow rate control part), and a valve 243a, which is an opening/closing valve, are installed in the gas supply pipe 232a sequentially from the upstream side. A gas supply pipe 232b, which is configured to supply an oxygen (O)-containing gas such as an oxygen ($O_2$) gas or an inert gas such as an $N_2$ gas, is connected to the gas supply pipe 232a at the downstream side of the valve 243a. An MFC 241b and a valve 243b are installed in the gas supply pipe 232b sequentially from the upstream side.

The gas generator 250a is configured to vaporize a hydrogen peroxide solution or make the hydrogen peroxide solution misty by heating it to a predetermined temperature (vaporizing temperature) which falls within a range of, for example, 120 to 200 degrees C., under a substantially atmospheric pressure, thereby generating a processing gas. Here, the hydrogen peroxide solution refers to an aqueous solution obtained by dissolving hydrogen peroxide ($H_2O_2$), which is liquid at a room temperature, in water ($H_2O$) as a solvent. The gas obtained by vaporizing the hydrogen peroxide solution contains $H_2O_2$ and $H_2O$ at predetermined concentrations, respectively. Hereinafter, this gas will be referred to as an "$H_2O_2$-containing gas". The $H_2O_2$ contained in this gas is a kind of active oxygen, and it is unstable and thus easy to release O, thereby generating hydroxy radical (OH radical) having a very strong oxidizing power. Therefore, the $H_2O_2$-containing gas acts as a strong oxidizing agent (O source) in a substrate processing process as described hereinbelow.

A processing gas ($H_2O_2$-containing gas) supply system is mainly configured by the gas supply pipe 232a, the MFC 241a, and the valve 243a. In addition, an O-containing gas supply system and an inert gas supply system are mainly configured by the gas supply pipe 232b, the MFC 241b, and the valve 243b.

Furthermore, in the substrate processing process as described hereinbelow, there may be a case where the $H_2O_2$-containing gas is supplied into the reaction tube 203 by setting the temperature of the wafer accommodation region in the reaction tube 203 to 120 degrees C. or lower, and by setting the temperature of the wafer accommodation region to a lower temperature, for example, a low temperature state of 80 degrees C. or lower, in order to further improve the characteristics of a film to be processed. In this case, the $H_2O_2$-containing gas is generated by the gas generator 250a and then supplied into the reaction tube 203 while maintaining a temperature at which it is not re-liquefied in the gas supply pipe 232a. However, at least a portion of the $H_2O_2$-containing gas supplied into the reaction tube 203 is re-liquefied (condensed) by contact with the members or the surfaces of the wafers 200 in the reaction tube 203, which are in a low temperature state (e.g., 100 degrees C. or lower) at which the $H_2O_2$-containing gas is liquefied.

In particular, the heating by the substrate heater 207 is not performed in the furnace opening peripheral region in the reaction tube 203. Therefore, in the case where no heater is installed in addition to the substrate heater 207, the temperature in the furnace opening peripheral region is easy to become lower than that of the wafer accommodation region, and thus the $H_2O_2$-containing gas is likely to be re-liquefied. The liquid generated by the re-liquefaction flows downward along the inner wall of the reaction tube 203, the surface of the boat 217 or the like, and stays near the furnace opening (for example, on the upper surface of the seal cap 219).

Here, since the boiling point (141 degrees C. at an atmospheric pressure) of $H_2O_2$ is higher than the boiling point (100 degrees C. at an atmospheric pressure) of $H_2O$ (i.e., the saturated vapor pressure of $H_2O_2$ is lower than the saturated vapor pressure of $H_2O$), $H_2O_2$ is likely to be liquefied preferentially among these. Therefore, the liquid generated by re-liquefaction of the $H_2O_2$-containing gas is easy to be in a state in which $H_2O_2$ is concentrated to a high concentration, i.e., high concentration $H_2O_2$ water (high concentration hydrogen peroxide solution). Furthermore, since $H_2O$ contained in the hydrogen peroxide solution is likely to be preferentially vaporized compared to $H_2O_2$, the liquid generated by re-liquefaction of the $H_2O_2$-containing gas, namely $H_2O_2$ may become further concentrated to a high concentration by vaporization of $H_2O$. In particular, a heater for the furnace opening is installed near the furnace opening where the liquid generated by re-liquefaction of the $H_2O_2$-containing gas stays, and when the liquid is heated to, for example, 100 degrees C. or higher, the concentration of $H_2O_2$ is further promoted. Generally, since $H_2O_2$ has high reactivity to a metal material, metal members (metal parts or metal components) such as the seal cap 219 or the rotary shaft 255, which is exposed to the $H_2O_2$-containing gas, may be damaged by the gas. However, since the high concentration $H_2O_2$ water is more reactive than that of the $H_2O_2$-containing gas and has a strong corrosive action, it may be possible to more seriously damage these metal members.

As a measure to prevent the metal members from the damage, it may be considered that a nickel (Ni) alloy (for example, Hastelloy C-22 or the like manufactured by Haynes International Company) or the like, which has been conventionally used as a metal material excellent in corrosion resistance, is used as a material of these metal members. However, as illustrated in experimental examples which will be described later, in the case where the materials such as the Ni alloy or the like are used as these metal members, it has been found that these materials react with $H_2O_2$ to cause corrosion. Furthermore, in the case where the Ni alloy is used as the material of the metal members, it has been found that this material reacts with $H_2O_2$ to reduce the concentration of the $H_2O_2$-containing gas, or that the high concentration $H_2O_2$ water is decomposed to generate oxygen in the process chamber, which may affect the gas concentration in the process chamber.

In order to avoid this problem, in some embodiments, a metal member, which constitutes at least one of the process chamber 201, the processing gas supply system, and the exhaust system, namely a metal member exposed to the $H_2O_2$-containing gas or liquid generated by liquefaction of the $H_2O_2$-containing gas (i.e., high concentration $H_2O_2$ water), is made of a material containing an iron element, and a baking process (heat treatment) for forming a layer of stable oxide of iron (iron oxide, FeOx) is performed on a surface where the metal member is exposed to the $H_2O_2$-containing gas or the liquid described above. Details of the baking process will be described later.

Specifically, the baking process is performed on a member facing the interior of the reaction chamber 201, a member in contact with the $H_2O_2$-containing gas in the processing gas supply system and the exhaust system, or the like. In some embodiments, as illustrated in FIG. 2, the seal cap 219, the rotary shaft 255, and a connection pipe 231*b* connecting the exhaust pipe 231 and the reaction tube 203 are made of a SUS material which is a material containing an iron element, and a stable iron oxide layer is formed by performing the baking process on them.

In particular, since there is a high possibility that the metal member facing the interior of the reaction chamber 201 near the furnace opening, for example, the seal cap 219 or the rotary shaft 255, is exposed to the high concentration $H_2O_2$ water generated when the $H_2O_2$-containing gas is liquefied, the reaction such as corrosion is more likely to occur than a member exposed only to the $H_2O_2$-containing gas. Therefore, it is particularly desirable that a stable iron oxide layer be formed at least on the surface facing the interior of the reaction chamber 201 by performing the baking process on these metal members. Furthermore, in the case where the exhaust pipe 231 or the connection pipe 231*b* is formed of a metal member, similarly, it is desirable to form a stable iron oxide layer on the surface (namely, the inner surface of the pipe) that is exposed to an exhaust gas containing the $H_2O_2$-containing gas by the baking process.

In addition, these metal members subjected to the baking process need not all necessarily be made of a material containing an iron element and it is enough that at least the vicinity of the surface is made of the corresponding material so that an iron oxide layer can be formed at least on the surface of a portion exposed to the $H_2O_2$-containing gas or the high concentration $H_2O_2$ water by the baking process.

Furthermore, in some embodiments, the members such as the reaction tube 203, the gas supply port 203*p*, the exhaust port 231*a*, and the like are made of a nonmetallic material such as quartz or silicon carbide. However, when these members are made of a metallic material, the same effects can be achieved by performing the same process on the metal material. In addition, in some embodiments, the gas supply pipe 232*a* is disposed outside the reaction tube 203, but the $H_2O_2$-containing gas may be supplied into the reaction chamber 201 from a gas supply nozzle in the reaction tube 203 by installing the gas supply nozzle which is erected from near the furnace opening in the reaction tube 203 and connecting the gas supply nozzle and the gas supply pipe 232*a*. When the gas supply nozzle is made of a metallic material, the same effects can be achieved by performing the same process on the metal material. Furthermore, since the rotary shaft 255 needs to support the boat 217 supporting the plurality of wafers 200 from below, it is desirable that the rotary shaft 255 be made of a metallic material having a high strength against a weight load. Thus, it is highly necessary to perform the baking process.

Figure 3:
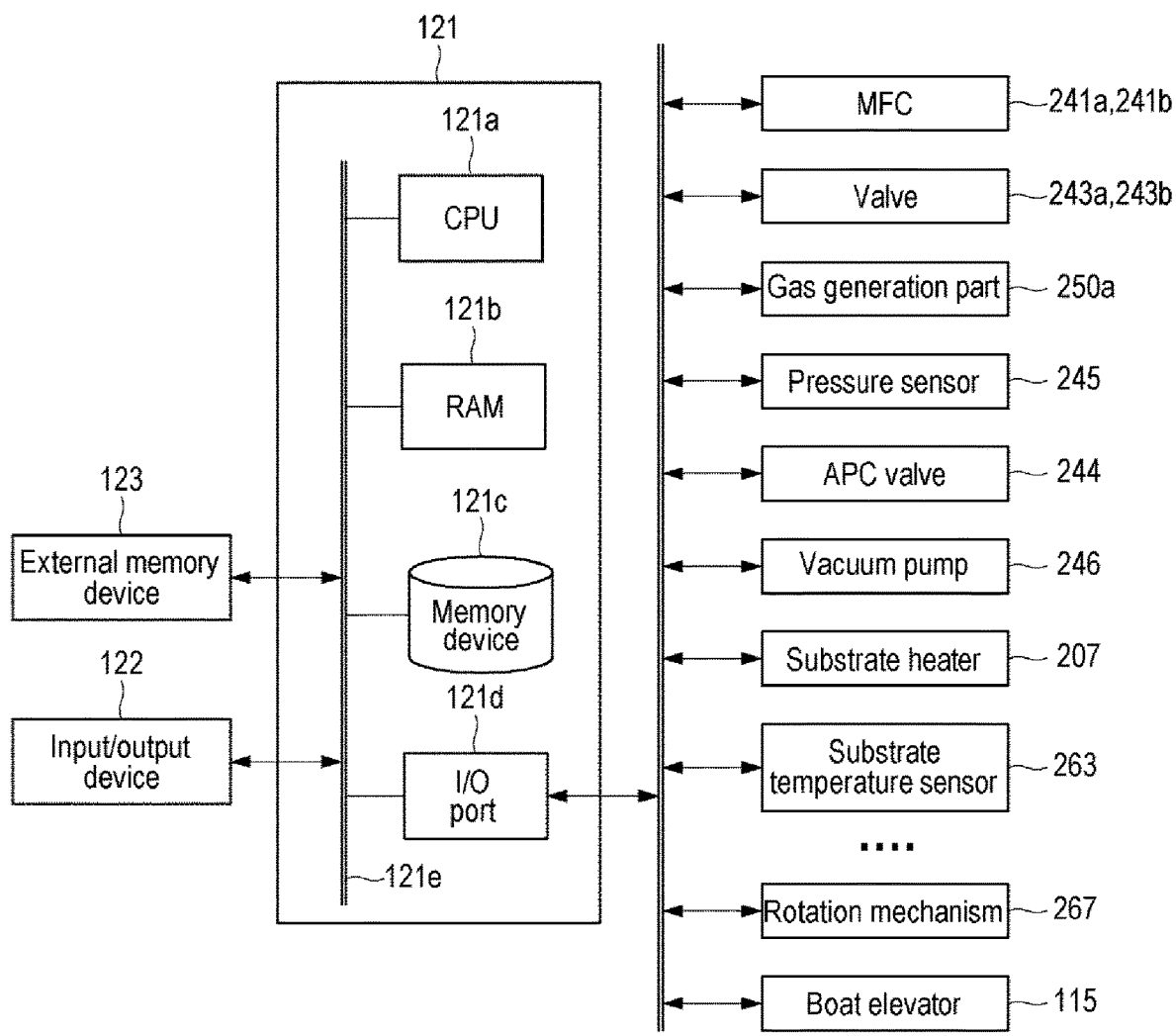
FIG. 3 is a schematic configuration diagram of a controller of the substrate processing apparatus suitably used in some embodiments of the present disclosure, in which a control system of the controller is shown in a block diagram.

As illustrated in FIG. 3, a controller 121, which is a control part (control means), may be configured as a computer including a central processing unit (CPU) 121*a*, a random access memory (RAM) 121*b*, a memory device 121*c*, and an I/O port 121*d*. The RAM 121*b*, the memory device 121*c* and the I/O port 121*d* are configured to exchange data with the CPU 121*a* via an internal bus 121*e*. An input/output device 122 formed of, e.g., a touch panel or the like, is connected to the controller 121.

The memory device 121*c* is configured by, for example, a flash memory, a hard disk drive (HDD), or the like. A control program for controlling operations of a substrate processing apparatus, a process recipe for specifying sequences and conditions of substrate processing as described hereinbelow, or the like is readably stored in the memory device 121*c*. The process recipe functions as a program for causing the controller 121 to execute each sequence in the substrate processing process, as described hereinbelow, to obtain a predetermined result. Hereinafter, the process recipe and the control program will be generally and simply referred to as a "program". Furthermore, the process recipe will be simply referred to as a "recipe". When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a and 241b, the valves 243a and 243b, the gas generator 250a, the pressure sensor 245, the APC valve 244, the vacuum pump 246, the substrate heater 207, the substrate temperature sensor 263, the rotation mechanism 267, the boat elevator 115, and the like, as mentioned above.

The CPU 121a is configured to read the control program from the memory device 121c and execute the same. The CPU 121a also reads the recipe from the memory device 121c according to an input of an operation command from the input/output device 122. In addition, the CPU 121a is configured to control, according to the contents of the recipe thus read, the gas generating operation by the gas generator 250a, the flow rate adjusting operation of various kinds of gases by the MFCs 241a and 241b, the opening/closing operation of the valves 243a and 243b, the opening/closing operation of the APC valve 244, the pressure regulating operation performed by the APC valve 244 based on the pressure sensor 245, the driving and stopping of the vacuum pump 246, the temperature adjusting operation performed by the substrate heater 207 based on the substrate temperature sensor 263, the operation of rotating the boat 217 with the rotation mechanism 267 and adjusting the rotation speed of the boat 217, the operation of moving the boat 217 up and down with the boat elevator 115, and the like.

The controller 121 may be configured by installing, on the computer, the aforementioned program stored in an external memory device 123 (for example, a magnetic disk such as a hard disk, an optical disc such as a CD, a magneto-optical disc such as an MO, or a semiconductor memory such as a USB memory). The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using a communication means such as the Internet or a dedicated line, instead of using the external memory device 123.

(2) Baking Process on Metal Members

The aforementioned baking process on the metal members will be described in detail below. In the some embodiments, the seal cap 219, the rotary shaft 255, and the connection pipe 231b are made of a SUS (SUS316L) material. In some embodiments, a baking process (first baking process) is performed on these metal members under the following condition (first baking process condition).

<First Baking Process Condition>
  Processing temperature: 180 to 500 degrees C., specifically 200 to 400 degrees C., for example, about 400 degrees C.
  Processing time period: 2 to 8 hours, specifically 3 hours or more (stable processing time period not including time period for temperature rising and temperature dropping)
  Processing atmosphere: atmosphere (air)
  Processing pressure: atmospheric pressure (1 atm)

By performing the baking process in this manner, a layer of stable oxide of iron (iron oxide), more specifically an iron oxide layer made of FeO (iron oxide (II)), $Fe_2O_3$ (iron oxide (III)) or the like, is formed on the surface of the SUS material.

Figure 4:
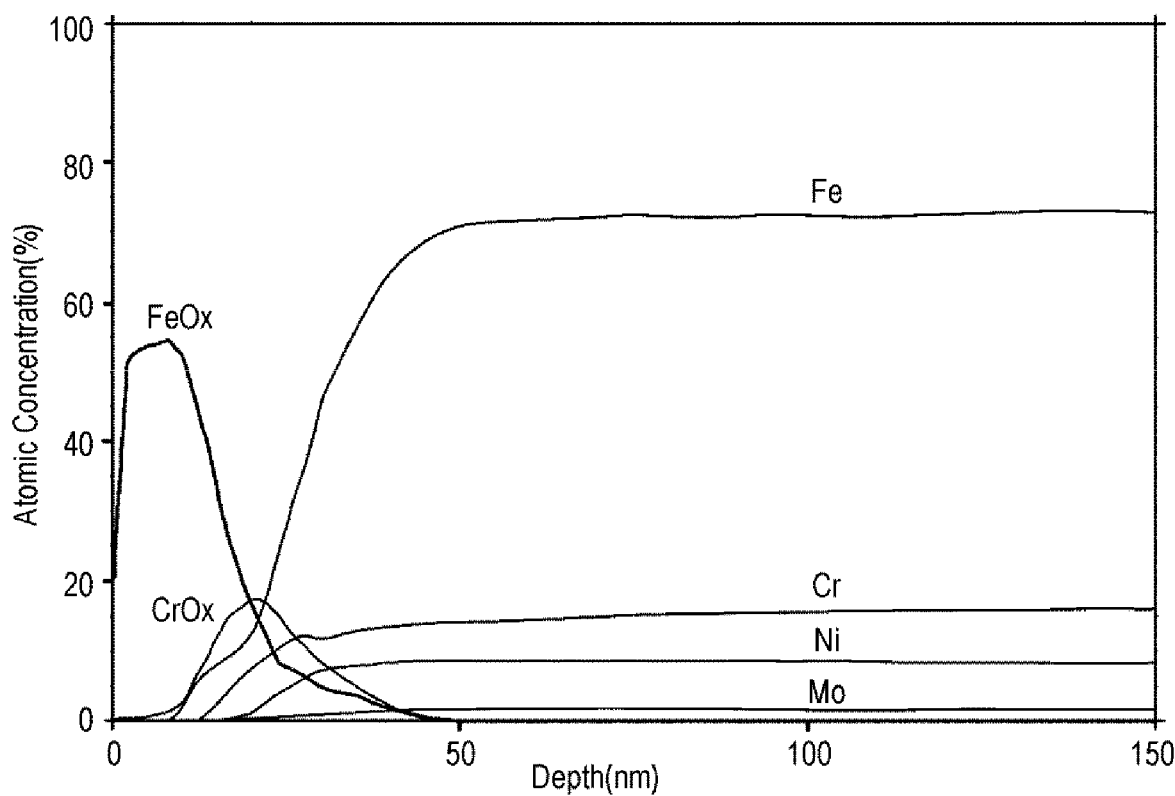
FIG. 4 is a graph showing an analysis result using an X-ray photoelectron spectroscopy for a SUS316L material subjected to a first baking process.

FIG. 4 is a graph showing a result of analyzing the distribution of elements in a depth direction using an X-rays photoelectron spectroscopy (XPS) for a SUS316L material subjected to the first baking process. The vertical axis indicates an atomic concentration (%), and the horizontal axis indicates a distance (depth) from the surface. As shown in the graph, by performing the first baking process, a layer having a high content of iron oxide, whose rate of iron oxide (FeOx on the graph) is 50% or more, is formed near the surface of the SUS316L material. On the other hand, usually, a layer having, as a main component, chromium oxide (CrOx) functioning as a passive film on the surface of the SUS material is not formed near the surface of the SUS material after the first baking process. The stable iron oxide layer formed on the surface of the SUS material by the first baking process functions as a passive film for $H_2O_2$ (specifically, the $H_2O_2$-containing gas or high concentration $H_2O_2$ water) to provide the SUS material with properties (resistance) such as corrosion resistance or nonreactivity.

Furthermore, a baking process (second baking process) may be performed under the following condition (second baking condition), instead of the first baking condition.

<Second Baking Process Condition>
  Processing temperature: 180 to 500 degrees C., specifically 200 to 400 degrees C., for example, about 400 degrees C.
  Processing time period: 2 to 8 hours, specifically 3 hours or more (stable processing time period not including time period for temperature rising and temperature dropping)
  Processing atmosphere: substantially vacuum
  Processing pressure: vacuum or substantially vacuum (about 100 Pa or lower)

That is, in the first baking process, the process is performed under an air atmosphere, whereas in the second baking process, the process is performed in a substantially vacuum state. By performing the baking process in this manner, a layer of stable oxide of iron (iron oxide) is formed on the surface of the SUS material as in the first baking process.

Figure 5:
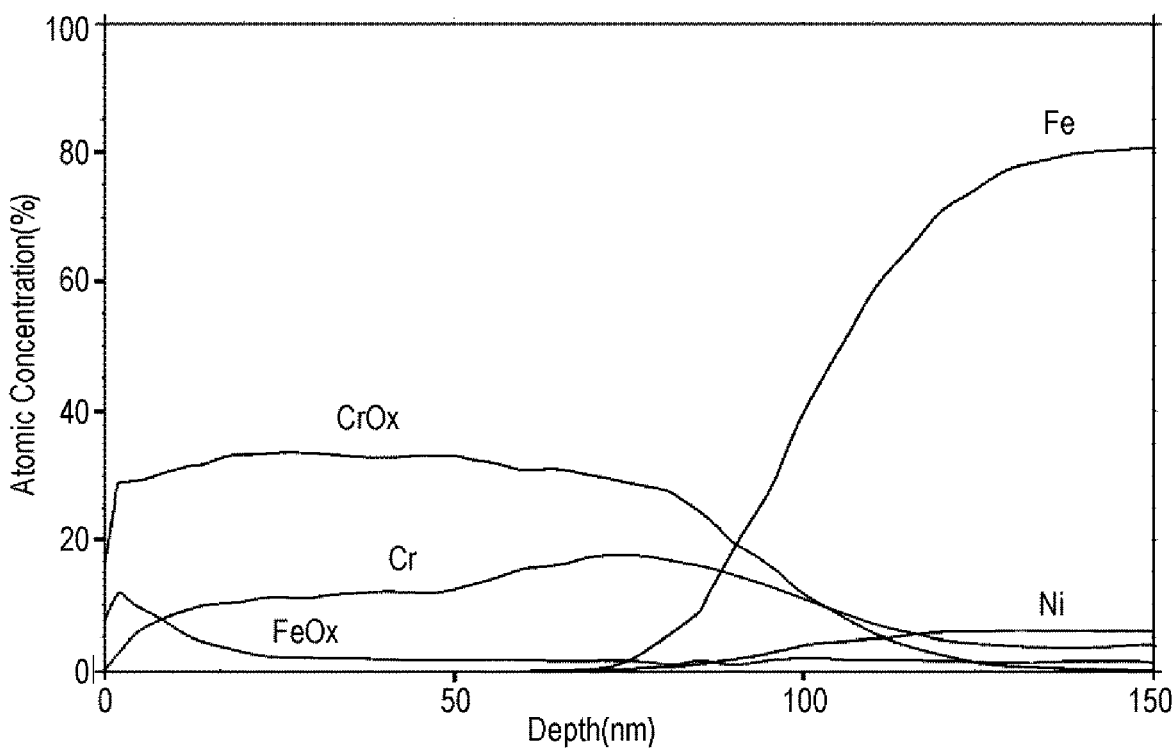
FIG. 5 is a graph showing an analysis result using an X-ray photoelectron spectroscopy for a SUS316 material subjected to a second baking process.

FIG. 5 is a graph showing a result of analyzing the distribution of elements in a depth direction using an X-ray photoelectron spectroscopy for a SUS316 material subjected to the second baking process. As shown in the graph, by performing the second baking process, a layer containing 10% or more of iron oxide (FeOx in the graph) is formed near the surface of the SUS316 material. On the other hand, the second baking process is different from an example of the first baking process in that the layer near the surface of the SUS material contains chromium oxide (CrOx) at a high rate (about 30%). However, as will be described in comparison with a comparative example to be described later, it is considered that a layer containing stable iron oxide (for example, a layer containing at least 10% or more of iron oxide), which is formed on the surface of the SUS material by the second baking process, functions as a passive film for $H_2O_2$ to provide the SUS material with the properties such as corrosion resistance or nonreactivity as in the first baking process.

(3) Comparison between the Present Embodiments and Comparative Example

Next, experimental results of differences of corrosion resistance or nonreactivity to $H_2O_2$ when different surface treatments (Nos. 1 to 6) are performed on a SUS material (SUS304) as a sample are shown in FIG. 6. In this experiment, after the sample subjected to each of the surface treatments was immersed in 100 ml of $H_2O_2$ water (immersion liquid) having a concentration of 30 wt % at a room temperature for 4 weeks, changes in weight of the sample and changes in concentration (liquid concentration) of immersed $H_2O_2$ water were measured. When the weight of the sample is decreased (lost), it indicates that the material is precipitated in the immersion liquid, which may be used as an index of the degree of occurrence of metal contamination. In addition, when the $H_2O_2$ concentration of the immersion liquid after the elapse of 4 weeks is decreased, it indicates that the material is reacting with $H_2O_2$, which may be used as an index of the degree of reactivity of each surface-treated material.

Surface treatment No. 1:

An experimental example of No. 1 shows an experimental result of a SUS material not subjected to the surface treatment.

Surface treatment No. 2:

An experimental example of No. 2 shows an experimental result of a SUS material subjected to the baking process under the first baking condition. In this experimental example, the processing temperature was set to about 400 degrees C. and the processing time period was set to about 3 hours.

Surface treatment No. 3:

An experimental example of No. 3 shows an experimental result of a SUS material subjected to electrolytic polishing (composite electrolytic polishing (1)) using nitric acid and sodium nitrate.

Surface treatment No. 4:

An experimental example of No. 4 shows an experimental result of a SUS material subjected to the first baking process similar to No. 2, in addition to the surface treatment (composite electrolytic polishing (1)) in No. 3.

Surface treatment No. 5:

An experimental example of No. 5 shows an experimental result of the SUS material subjected to electrolytic polishing (composite electrolytic polishing (2)) using sodium nitrate.

Surface treatment No. 6:

An experimental example of No. 6 shows an experimental result of a SUS material subjected to the baking process under the second baking condition, in addition to the surface treatment (composite electrolytic polishing (2)) in No. 5. In this experimental example, the processing temperature in the second baking process was set to about 400 degrees C. and the processing time period was set to about 3 hours.

<Effects of the First Baking Process>

According to the experimental results of Nos. 2 and 4 in which the first baking process was performed, it was confirmed that the weight changes of the sample in both experimental examples were all very small as—0.002%, and thus the material was not almost precipitated in the immersion liquid. It was also confirmed that the changes in the immersion liquid concentration were all 0% in both experimental examples, and the sample did not substantially react with the $H_2O_2$ water.

On the other hand, according to the experimental results of Nos. 1, 3, and 5 in which the first baking process was not performed, it was confirmed that, regarding the weight changes of the sample, in any of the experimental examples, the change amounts were slightly larger than the experimental results of Nos. 2 and 4 in which the first baking process was performed. Thus, it can be seen that, by performing the first baking process on the SUS material, it is possible to provide the SUS material with excellent corrosion resistance or nonreactivity to $H_2O_2$.

<Effects of the Second Baking Process>

Furthermore, according to the experiment result of No. 6 in which the second baking process was performed, it was confirmed that the weight change of the sample was very small as +0.001%, and the material was not almost precipitated in the immersion liquid as in the first baking process. It was also confirmed that the change in immersion liquid concentration was −0.2%, and the reactivity of the sample to the $H_2O_2$ water was very low. That is, in the case where the second baking process was performed on the SUS material, it can be seen that, although a slight reaction was seen compared to the experimental examples Nos. 2 and 4 in which the first baking process was performed, remarkable improvement in corrosion resistance or nonreactivity to $H_2O_2$ was obtained compared to the experimental examples Nos. 1, 3, and 5 in which the first or second baking process was not performed.

Here, in the experimental examples of Nos. 2, 4, and 6, it is presumed that the factor of greatly improving the corrosion resistance or nonreactivity to $H_2O_2$ is that the layer containing stable iron oxide (FeOx) is formed on the surface of the SUS material by the first or second baking process. That is, even in the experimental example of No. 3 or 5, although a layer containing stable chromium oxide is formed on the surface of the SUS material, sufficient characteristics are not obtained, particularly in terms of the change in the immersion liquid concentration. In contrast, in the experimental examples of Nos. 2, 4, and 6, it is presumed that, by performing the first or second baking process, the layer containing stable iron oxide is newly formed on the surface of the material, and thus significant improvement is obtained by such difference. That is, it is presumed that the layer containing stable iron oxide is excellent in function as a passive film for $H_2O_2$, compared to the layer (film) containing chromium oxide as a main component. In order to obtain the aforementioned characteristic improvement, it is desirable that the layer contains at least 10% or more of stable iron oxide.

In order to improve the corrosion resistance or nonreactivity to $H_2O_2$ in the metal member by performing the first or second baking process, it is necessary to configure at least a portion near the surface of the metal member to be processed with a material containing an iron element. More specifically, it is desirable that the material containing iron element contains 50% or more of iron element. In the case where the content rate of the iron element is less than 50%, even if the first or second baking process was performed, there is a possibility that the layer containing stable iron oxide cannot be formed to have a sufficient thickness to obtain the aforementioned characteristic improvement effect, or to become a sufficiently dense layer.

Examples of a metal material containing 50% or more of iron element may include steel materials (93 to 98%), SUS304 (71%), SUS316L (67%), SUS310S (50%), and the like. However, in the case of the steel materials, since unstable iron oxide (so called rust) is formed in advance on the surface in the air, even if the first or second baking process was performed, it is generally hard to form a layer containing stable iron oxide such as, e.g., FeO, on the surface. Alternatively, a step of removing unstable iron oxide on the surface needs to be performed before the first or second baking process. Therefore, in order to form a layer containing stable iron oxide on the surface of the member, it is desirable to use a SUS material which is hard to form unstable iron oxide on the surface in the air by forming a passive film of chromium oxide by natural oxidation. That is, it can be said that it is desirable that the chromium element be contained in the material.

Furthermore, it is considered that, by performing the first baking process in an air atmosphere containing oxygen, it is possible to further increase the content rate of stable iron oxide near the surface of a member made of a material containing an iron element compared to the second baking process (according to the first baking process, for example, a layer having an iron oxide content rate of 50% or more can be formed). Therefore, as can be seen from comparison of the experimental results of Nos. 2, 4, and 6, in the first baking process, the aforementioned effects due to the layer containing iron oxide can be further enhanced compared to the second baking process. Furthermore, compared to the case where the process is performed in a substantially vacuum state as in the second baking process, since the facilities or the like necessary for the process can be further simplified when the process is performed in an air atmosphere as in the first baking process, it is possible to reduce the processing cost. That is, the first baking process is more desirable even in view of cost.

Next, as another comparative example, an experimental example of verifying the corrosion resistance or nonreactivity to $H_2O_2$ when a material other than the SUS material is used as a sample will be described with reference to FIG. 7. The experimental conditions of experimental examples Nos. 7 to 10 as set forth below may be similar to those of Nos. 1 to 6.

Surface Treatment No. 7:

An experimental example of No. 7 shows an experimental result of an Ni alloy not subjected to the surface treatment, specifically Hastelloy C-22.

Surface Treatment No. 8:

An experimental example of No. 8 shows an experimental result of an Ni alloy subjected to the baking process under the second baking conditions. In this experimental example, the processing temperature was set to about 400 degrees C. and the processing time period was set to about 3 hours.

Surface Treatment No. 9:

An experimental example of No. 9 shows an experimental result of a SUS material whose surface is coated with an yttrium oxide ($Y_2O_3$) film known as a passive film.

Surface Treatment No. 10:

An experimental example of No. 10 shows an experimental result of a SUS material whose surface is coated with a nickel fluoride ($NiF_2$) film known as a passive film.

According to the experimental result of No. 7, it can be seen that the weight change of the sample made of a Ni alloy as a material was −0.064%, which is very large compared with the other experiment examples. Furthermore, it can be seen that, also regarding the change of the immersion liquid concentration, in the experiment example of No. 8, the concentration after the experiment is 0% and the Ni alloy is a material which easily causes to react with $H_2O_2$.

On the other hand, according to the experimental example of No. 8, the second baking process was performed on the sample in the same manner as in the experimental example of No. 6. However, it was confirmed that significant improvement was not obtained from the experiment result of No. 7 both in the weight change and in the immersion liquid concentration change of the sample. As described above, it is considered that the improvement of the corrosion resistance or nonreactivity to $H_2O_2$ can be obtained by forming the layer containing stable iron oxide on the surface because it is presumed that the factor is that such a layer is not formed due to non-inclusion of an iron element in the Ni alloy.

According to the experiment result of No. 9, it was confirmed that in the experimental example of a SUS material coated with a $Y_2O_3$ film on its surface, good results were obtained in both the weight change and the immersion liquid concentration change. However, it was confirmed that significant discoloration occurs on the coating film during the experiment, and there was a possibility that some reaction could occur between the $Y_2O_3$ film and $H_2O_2$. Therefore, it is considered that the surface treatment with the $Y_2O_3$ film is undesirable in terms of nonreactivity with $H_2O_2$.

According to the experiment result of No. 10, it can be seen that in the experimental example of the SUS material coated with the $NiF_2$ film on its surface, relatively good results were obtained in both the weight change and the immersion liquid concentration change. However, in the case of this experimental example, it was confirmed that black spots on pinholes occurred on the coating film during the experiment, and there was a possibility that some reaction could occur between the $NiF_2$ film and $H_2O_2$. Therefore, similar to the $Y_2O_3$ film, it is considered that the surface treatment with the $NiF_2$ film is also undesirable in terms of nonreactivity with $H_2O_2$.

(4) Pre-processing Process

A pre-processing process performed before performing a substrate processing process as described hereinbelow on a wafer 200 will now be described with respect to FIG. 8.

Figure 8:
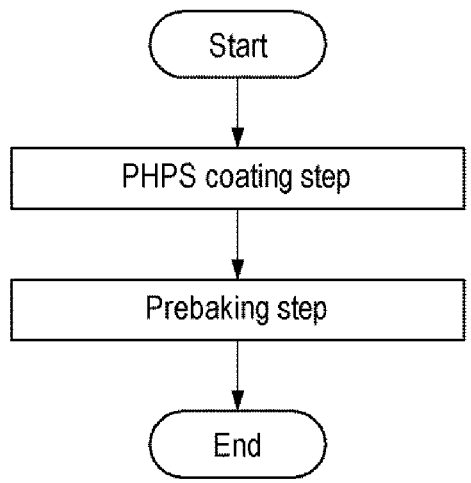
FIG. 8 is a diagram illustrating an example of a flow of a pre-processing process.

As illustrated in FIG. 8, in this process, a polysilazane (PHPS) coating step and a prebaking step are sequentially performed on the wafer 200. At the PHPS coating step, the surface of the wafer 200 is coated with a coating liquid (polysilazane solution) containing polysilazane using a method such as a spin coating method or the like. At the prebaking step, a solvent is removed from this film by heating the wafer 200 on which the coating film is formed. By heating the wafer 200 having the coating film formed thereon at a processing temperature (prebaking temperature) which falls within a range of, for example, 70 to 250 degrees C., the solvent can be volatilized from the interior of the coating film. This heating treatment is preferably performed at about 150 degrees C.

The coating film formed on the surface of the wafer 200 becomes a film (polysilazane film) having a silazane bond (—Si—N—) by passing through the prebaking step. The polysilazane film contains nitrogen (N) and hydrogen (H) in addition to Si, and in some cases, carbon (C) and other impurities may be mixed. In the substrate processing process as described hereinbelow, this film is modified (oxidized) by supplying an $H_2O_2$-containing gas to the polysilazane film formed on the wafer 200 under a relatively low temperature condition.

(5) Substrate Processing Process

Figure 9:
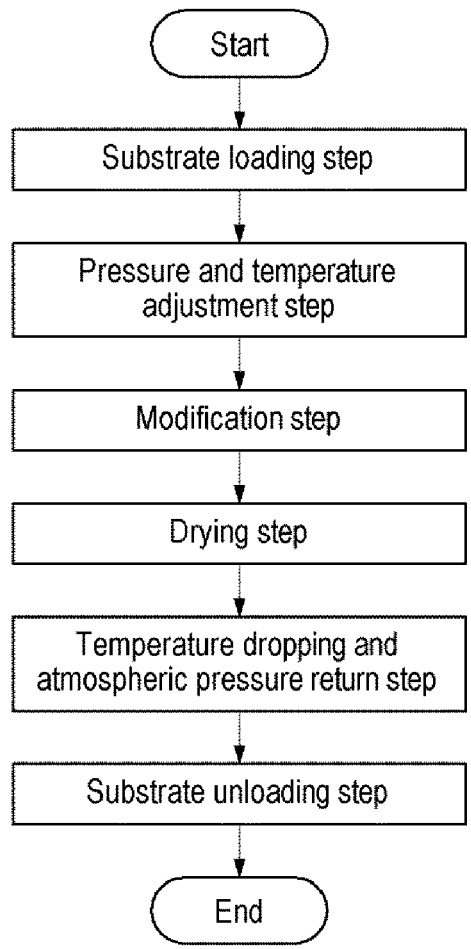
FIG. 9 is a flowchart illustrating an example of a substrate processing process performed after the pre-processing process.

Next, an example of a substrate processing process performed using the aforementioned substrate processing apparatus, which is one of the processes of manufacturing a semiconductor device, will be described with reference to FIG. 9. In the following descriptions, the operations of the respective parts constituting the substrate processing apparatus are controlled by the controller 121.

(Substrate Loading Step)

A plurality of wafers 200 on which the aforementioned polysilazane film is formed on their surfaces are charged on the boat 217 (wafer charging). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the reaction tube 203 through the O-ring 220.

(Pressure Regulation and Temperature Adjustment Step)

The interior of the process chamber 201, namely the space in which the wafers 200 exist, is exhausted by the vacuum pump 246 so as to reach a predetermined pressure (modifying pressure). In this operation, the internal pressure of the process chamber 201 is measured by the pressure sensor 245. The APC valve 244 is feedback-controlled based on the measured pressure information. The vacuum pump 246 may be continuously actuated at least until the processing of the wafers 200 is completed.

Furthermore, the wafers 200 in the process chamber 201 are heated by the substrate heater 207 to a desired processing temperature (modifying temperature). In this operation, the power of the substrate heater 207 is feedback-controlled based on the temperature information detected by the substrate temperature sensor 263 such that the interior of the process chamber 201 has a predetermined temperature distribution. The wafers 200 are heated such that the modifying temperature becomes 120 degrees C. or lower, specifically 100 degrees C. or lower, for example, a room temperature (25 degrees C.) to 90 degrees C., specifically 60 to 90 degrees C., in order to further improve the characteristics of a silicon oxide film (SiO film) obtained at a modification step as described hereinbelow. The heating of the interior of the process chamber 201 by the substrate heater 207 may be continuously performed at least until the processing of the wafers 200 is completed.

Furthermore, the rotation of the wafers 200 by the rotation mechanism 267 begins. The rotation of the wafers 200 may be continuously performed at least until the processing of the wafers 200 is completed.

(Modification Step)

When the internal pressure of the process chamber 201 reaches a predetermined processing pressure and the temperature of the wafers 200 reaches a predetermined processing temperature, the valve 243a is opened to start the supply of an $H_2O_2$-containing gas into the reaction tube 203 via the MFC 241a, the gas supply pipe 232a, and the gas supply port 203p. The $H_2O_2$-containing gas supplied into the process chamber 201 flows downward in the process chamber 201, and is discharged to the outside of the reaction tube 203 via the exhaust pipe 231. At this time, the $H_2O_2$-containing gas is supplied to the wafers 200. As a result, an oxidation reaction occurs on the surface of the wafers 200 to modify the polysilazane film formed on the wafers 200 into an SiO film.

The $H_2O_2$-containing gas has a very strong oxidizing power as described above. Therefore, by using the $H_2O_2$-containing gas as the processing gas, it is possible to perform an oxidation treatment up to a deep portion (a bottom portion of a groove) of the polysilazane film formed in the groove on the surface of the wafers 200. As a result, it is possible to make the degree of the modification process uniform between the surface portion of the polysilazane film and the deep portion thereof, and to make the physical properties such as a dielectric constant of the finally obtained SiO film uniform in its thickness direction. Furthermore, by using the $H_2O_2$-containing gas as the processing gas, it is able to perform the oxidation treatment under the low temperature condition as described above, and the heat history received at the wafers 200 may be well managed.

In addition, when the $H_2O_2$-containing gas is supplied into the reaction tube 203, the $H_2O_2$-containing gas may be confined in the reaction tube 203 such that the interior of the reaction tube 203 becomes in a pressurized state by closing the APC valve 244 or make the opening degree thereof small. This makes it possible to equalize the concentration distribution of the $H_2O_2$-containing gas in the reaction tube 203, and to improve the uniformity of the modification process between the wafers 200 and in the plane of the wafers 200. Furthermore, by pressurizing the interior of the reaction tube 203, it is possible to promote the aforementioned oxidation reaction and to improve the quality of the SiO film.

The processing conditions of the modification step may be exemplified as follows:

Modifying pressure: 700 to 1,000 hPa (substantially atmospheric pressure (normal pressure) or slightly reduced pressure)

Modifying temperature: room temperature to 90 degrees C., specifically 60 to 90 degrees C., particularly specifically about 80 degrees C.

$H_2O_2$-containing gas flow rate: 1.0 to 10 ccm, specifically 1.5 to 8 ccm $H_2O_2$ concentration in $H_2O_2$-containing gas: 1.5-18.5 mol %, specifically 2.1-13.5 mol %

$O_2$ gas flow rate: 0 to 20 SLM, specifically 5 to 10 SLM

Gas supply time period: 10 to 720 minutes.

After a predetermined time has elapsed and the modification of the polysilazane film into the SiO film is completed, the valve 243a is closed to stop the supply of the $H_2O_2$-containing gas into the reaction tube 203. When an $O_2$ gas is supplied from the gas supply pipe 232b at this step, simultaneously with the stop of the supply of the $H_2O_2$-containing gas or after a predetermined time has elapsed, the valve 243b may be closed to stop the supply of the $O_2$ gas into the reaction pipe 203 or the valve 243b may be kept opened until a next drying step starts or is completed so as to continuously supply the $O_2$ gas.

Furthermore, as described above, when the temperature (modifying temperature) of the members in the reaction tube 203 or the surface of the wafers 200 is lower than the temperature of the $H_2O_2$-containing gas supplied into the reaction tube 203, the $H_2O_2$-containing gas supplied into the reaction tube 203 is re-liquefied in the reaction tube 203 which is in a low temperature state, and stays near the furnace opening as high concentration $H_2O_2$ water. In particular, when the modifying temperature is 100 degrees C. or lower, the re-liquefaction in the reaction tube 203 is likely to occur. Therefore, in the some embodiments, a stable iron oxide layer is formed by forming the seal cap 219, the rotary shaft 255 and the connection pipe 231b with a SUS material and performing the first baking process on them. This makes it possible to provide these metallic members with the properties such as corrosion resistance or nonreactivity to $H_2O_2$.

(Drying Step)

After the modification step is completed, the wafers 200 are heated at a temperature higher than the aforementioned modifying temperature and at a predetermined temperature lower than the aforementioned prebaking temperature (drying temperature), by controlling the substrate heater 207. The drying temperature may be set at, for example, a temperature of 120 degrees C. or higher, specifically a temperature which falls in a range of 120 to 160 degrees C. By heating the wafers 200, the internal temperature of the reaction tube 203 also rises. After the temperature rises, the wafers 200 and the interior of the reaction tube 203 are gradually dried by keeping the temperature within the aforementioned range. The processing pressure of the drying step may be similar to, for example, the processing pressure of the modification step, and may be desirable to be a substantially atmospheric pressure (normal pressure) or a slightly reduced pressure. By performing the drying process, an impurity such as outgas due to the solvent, an impurity derived from $H_2O_2$, or the like, in addition to ammonia ($NH_3$), ammonium chloride ($NH_4Cl$), C, or H which is the byproduct separated from the polysilazane film, can be removed from the wafers 200, namely the interior of the SiO film or the surface of the SiO film. In addition, the re-adhesion of these substances to the wafers 200 may be suppressed.

The drying step may be performed in a state that the APC valve 244 is closed to stop the exhaust of the interior of the reaction tube 203, or may be performed in a state that the APC valve 244 is opened to continue the exhaust of the interior of the reaction tube 203. Moreover, the drying step may be performed while supplying and confining the $O_2$ gas into the reaction tube 203, or while continuing the supply and the exhaust of the $O_2$ gas into and from the reaction tube 203. By supplying the $O_2$ gas as a heat transfer medium into the reaction tube 203, it is possible to efficiently heat the wafers 200 or the reaction tube 203 and to improve the aforementioned impurity removal efficiency.

Furthermore, the aforementioned drying temperature is a temperature higher than the modifying temperature of the modification step. Therefore, when the drying step is performed while remaining the high concentration $H_2O_2$ water within the reaction tube 203 (particularly, near the furnace opening), the high concentration $H_2O_2$ water remaining within the reaction tube 203 wafers 200 may be heated together with the wafers 200. When the high concentration $H_2O_2$ water is heated, it is likely to be re-vaporized, particularly the re-vaporization of $H_2O$ contained in the high concentration $H_2O_2$ water is likely to be promoted. As a result, the high concentration $H_2O_2$ water remaining within the reaction tube 203 is further concentrated (the $H_2O_2$ concentration which was originally high becomes higher), which may cause more serious damage to the metal member such as the seal cap 219 or the like. Therefore, when this drying step is performed, it is particularly desirable to use the aforementioned member with resistance to the high concentration $H_2O_2$ water as the metal member such as the seal cap 219 or the like which is likely to be exposed to the high concentration $H_2O_2$ water.

Furthermore, as in other examples (modifications) as described hereinbelow, for example, when a heater for furnace opening is additionally installed near the furnace opening of the reaction tube 203, a furnace opening peripheral region may be heated to a temperature equal to or higher than the drying temperature by the furnace opening heater at the drying step. In this case, since the re-vaporization or concentration of the high concentration $H_2O_2$ water staying near the furnace opening is further promoted, it is more important to use the aforementioned member with resistance to the high concentration $H_2O_2$ water as a material constituting the metal member such as the seal cap 219 or the like.

(Temperature Dropping and Atmospheric Pressure Return Step)

After the drying step is completed, the APC valve 244 is opened and the interior of the reaction tube 203 is vacuum-exhausted. Thus, the particle or impurity remaining within the reaction tube 203 can be removed. After the vacuum-exhaust, the APC valve 244 is closed, and an $N_2$ gas is supplied from the gas supply pipe 232b to return the internal pressure of the reaction tube 203 to an atmospheric pressure. The internal pressure of the reaction tube 203 reaches the atmospheric pressure, and after the elapse of a predetermined period of time, the temperature is dropped to a desired temperature (unloadable temperature).

(Substrate Unloading Step)

The seal cap 219 is moved down by the boat elevator 115 to open the lower end of the reaction tube 203. Then, the processed wafers 200 are unloaded from the lower end of the reaction tube 203 to the outside of the reaction tube 203 (boat unloading). Thereafter, the processed wafers 200 are discharged from the boat 217 (wafer discharging), and the substrate processing process according to the some embodiments is completed.

Figure 10:
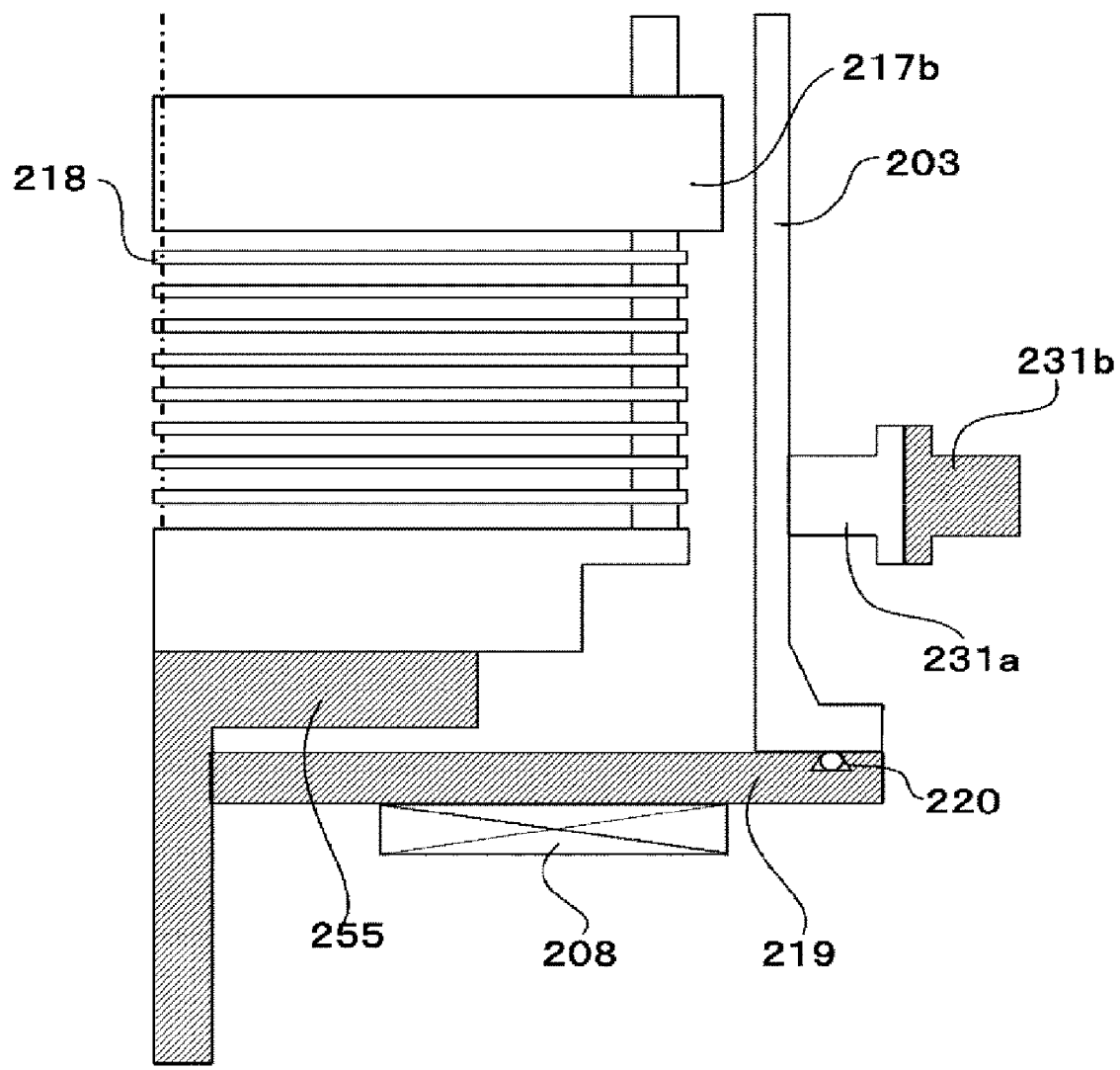
FIG. 10 is a schematic configuration diagram illustrating a configuration of a furnace opening peripheral region of a reaction tube in an exemplary modification of the present disclosure.

The some embodiments are not limited to the aforementioned embodiments, and as in an exemplary modification illustrated in FIG. 10, the furnace opening heater 208 may be installed near the furnace opening of the reaction tube 203, for example, under the seal cap 219. By installing the furnace opening heater 208, it is possible to control the temperature of the furnace opening peripheral region to a desired temperature at the modification step or the drying step described above.

<Other Embodiments of the Present Disclosure>

While some embodiments of the present disclosure have been specifically described above, the present disclosure is not limited to the aforementioned embodiments but may be differently modified without departing from the spirit of the present disclosure.

For example, the aforementioned embodiments, there has been described an example in which an $H_2O_2$-containing gas is generated outside the reaction tube 203. However, the present disclosure is not limited thereto, and the $H_2O_2$-containing gas may be generated inside the reaction tube 203. For example, hydrogen peroxide water may be supplied to the top plate 217a heated by a lamp heater or the like and vaporized therein to generate the $H_2O_2$-containing gas.

Furthermore, in the aforementioned embodiments, there has been described an example in which the aforementioned process is performed by supplying the $H_2O_2$-containing gas to the wafer 200. However, the present disclosure is not limited thereto, and the aforementioned process may be performed on the substrate by supplying a liquid containing $H_2O_2$, for example, $H_2O_2$ water, to the wafer 200.

In addition, for example, in the aforementioned embodiments, there has been described an example in which a substrate having a polysilazane film formed thereon is processed, but the present disclosure is not limited thereto. That is, in the case where a substrate having a film with a silazane bond (—Si—N—) formed thereon is processed, even if the film is not a polysilazane film, the same effects as those of the aforementioned embodiments may be achieved.

Moreover, for example, in the aforementioned embodiments, there has been described an example in which a polysilazane film formed by performing the PHPS coating step and the prebaking step is processed, but the present disclosure is not limited thereto. For example, even in the case where a polysilazane film formed by a CVD method and not prebaked is processed, the same effects as those of the aforementioned embodiments may be achieved.

According to the present disclosure, it is possible to reduce damage to the members of the substrate processing apparatus.

The some embodiments and modifications described above may be appropriately combined with one another. In addition, the processing conditions used at this time may be similar to, for example, the processing conditions of the aforementioned embodiments.

The present disclosure can be effective in the preparation of a substrate processing apparatus and a metal member, and thus has industrial applicability.

What is claimed is:

1. A substrate processing apparatus, comprising:
a process chamber in which a substrate is accommodated;
a processing gas supply system configured to introduce a processing gas containing hydrogen peroxide into the process chamber; and
an exhaust system configured to exhaust an interior of the process chamber,
wherein at least one selected from the group of the process chamber, the processing gas supply system, and the exhaust system includes a metal member,
wherein the metal member exposed to the processing gas or a liquid generated by liquefying the processing gas is made of a material containing an iron element, and
wherein a surface of a plane of the metal member, which is exposed to the processing gas or the liquid, is formed of a layer containing iron oxide which is formed by performing a baking process on the metal member.

2. The substrate processing apparatus of claim 1, wherein the baking process is performed under an atmosphere containing oxygen.

3. The substrate processing apparatus of Claim 2, wherein the baking process is performed under an air atmosphere.

4. The substrate processing apparatus of Claim 1, wherein the baking process is performed under a substantially vacuum state.

5. The substrate processing apparatus of Claim 1, wherein the layer containing iron oxide contains 10% or more of iron oxide.

6. The substrate processing apparatus of Claim 1, wherein the material containing the iron element is stainless steel.

7. The substrate processing apparatus of Claim 1, wherein the material containing the iron element contains 50 % or more of iron.

8. The substrate processing apparatus of Claim 1, further comprising:
a substrate boat configured to support the substrate in the process chamber; and
a boat support part configured to support the substrate boat from below,
wherein the process chamber is configured by a cylindrical reaction tube and a cover configured to seal a furnace opening of the reaction tube and to constitute a bottom portion of the process chamber, and
wherein the metal member constitutes at least a portion of the boat support part, the cover and an exhaust pipe of the exhaust system connected to the reaction tube.

9. The substrate processing apparatus of Claim 1, further comprising:
a heater configured to heat the substrate accommodated in the process chamber; and
a controller configured to control the heater such that a temperature of the substrate becomes a predetermined temperature of 100 degrees C or lower while controlling the processing gas supply system so as to supply the processing gas into the process chamber.

10. The substrate processing apparatus of Claim 1, further comprising:
a heater configured to heat the substrate accommodated in the process chamber; and
a controller configured to control the processing gas supply system and the heater,
wherein the controller is configured to control the heater such that a temperature of the substrate becomes a predetermined temperature of 100 degrees C or lower while controlling the processing gas supply system so as to supply the processing gas into the process chamber for a predetermined period of time, and then to control the processing gas supply system so as to stop the supply of the processing gas into the process chamber and also to control of the heater such that the temperature of the substrate becomes a predetermined temperature of 120 degrees C or higher.

* * * * *